(12) United States Patent
Lester et al.

(10) Patent No.: US 7,671,543 B2
(45) Date of Patent: Mar. 2, 2010

(54) LIGHT EXPOSURE CONTROL DEVICE AND APPARATUS

(75) Inventors: George H. Lester, Avon, CT (US); Thomas J. Cavanaugh, Canton, CT (US); Kirk A. Middlemass, Winchester Center, CT (US); Stephan J. W. Platzer, Longmeadow, MA (US)

(73) Assignee: Dymax Corporation, Torrington, CT (US)

( * ) Notice: Subject to any disclaimer, the term of this patent is extended or adjusted under 35 U.S.C. 154(b) by 670 days.

(21) Appl. No.: 11/656,754

(22) Filed: Jan. 23, 2007

(65) Prior Publication Data

US 2008/0175001 A1   Jul. 24, 2008

(51) Int. Cl.
*H05B 37/02* (2006.01)
*G03B 27/58* (2006.01)
*A47F 7/04* (2006.01)

(52) U.S. Cl. ............... 315/308; 355/71; 362/561
(58) Field of Classification Search .......... 315/308, 315/49; 355/35, 48, 50, 67, 71; 362/552, 362/554, 556, 510
See application file for complete search history.

(56) References Cited

U.S. PATENT DOCUMENTS

| | | | |
|---|---|---|---|
| 1,364,278 A | 1/1921 | Hochstetter | 353/97 |
| 1,792,046 A | 2/1931 | Skaupy | 362/291 |
| 1,810,669 A | 6/1931 | Loeb | 362/277 |
| 2,336,119 A | 12/1943 | Nettesheim | 362/269 |
| 2,735,929 A | 2/1956 | Erhardt et al. | 362/321 |
| 3,222,510 A | 12/1965 | Snyder | 362/280 |
| 3,371,202 A | 2/1968 | Moore et al. | 362/281 |
| 3,402,496 A | 9/1968 | Byrnes | 40/614 |
| 3,456,101 A | 7/1969 | Rentschler et al. | 362/4 |
| 4,018,527 A | 4/1977 | Bartel et al. | 355/71 |
| 4,257,086 A * | 3/1981 | Gulliksen | 362/279 |
| 4,425,599 A | 1/1984 | Rieder et al. | 362/552 |
| 4,834,071 A | 5/1989 | Hosoi et al. | 600/180 |
| 5,016,975 A | 5/1991 | Sasaki et al. | 385/117 |
| 5,748,816 A | 5/1998 | Jaksic et al. | 385/39 |
| 6,102,554 A | 8/2000 | Willson et al. | 362/281 |
| 6,515,430 B2 | 2/2003 | Kayser | 315/224 |
| 6,677,600 B2 * | 1/2004 | Ikeuchi | 250/504 R |
| 6,850,367 B2 * | 2/2005 | Osawa | 359/619 |
| 6,912,097 B2 * | 6/2005 | Woods | 359/739 |
| 7,008,070 B2 | 3/2006 | Nishida et al. | 362/19 |
| 2005/0030749 A1 | 2/2005 | Nishida et al. | 362/257 |

* cited by examiner

*Primary Examiner*—Douglas W Owens
*Assistant Examiner*—Minh D A
(74) *Attorney, Agent, or Firm*—Roberts & Roberts, LLP (57) ABSTRACT

The invention provides a light exposure apparatus containing a light exposure control device for curing light sensitive adhesives. The light exposure apparatus includes a) a light source; b) a light transmitter for transmitting light from the light source; and c) a light intensity controlling component between the light source and the light transmitter. The light intensity controlling component includes a light regulator having a planar face between the light source and the light transmitter. The light regulator has opaque members having a continuously tapered width, on the face of the light regulator. Each planar member is spaced from adjacent planar members by a light transparent segment having a tapered width, on the face of the light regulator. The light regulator is mounted such that a portion of the opaque members and portion of the substantially light transparent segments are adjustably positioned between the light source and the light transmitter.

26 Claims, 5 Drawing Sheets

LIGHT EXPOSURE CONTROL DEVICE AND APPARATUS

BACKGROUND OF THE INVENTION

1. Field of the Invention

The present invention relates to a light exposure control device, and a light exposure apparatus containing the light exposure control device. More particularly, the invention pertains to a light exposure control device and a light exposure apparatus for curing light sensitive adhesives. In the light exposure apparatus, light is preferably emitted by an optical fiber arrangement.

2. Description of the Related Art

A wide variety of means are known to control the illumination of a light exposure apparatus. For example, the illumination from the light source can be controlled by changing the current or voltage of the light source or by changing the effective phase section of the current. U.S. Pat. No. 6,515,430 shows a typical light exposure device including a lamp for shining light through a light delivery device which can be an optical fiber. Between the lamp and the optical fiber are a shutter and a diaphragm which controls the duration and intensity of light sent from the lamp to the optical fiber.

In other illumination control techniques, a neutral or gray wedge, a filter or a similar absorptive device can be placed in the optical path between the light source and the optical fiber. However, varying the illumination density by means of a gray wedge is limited and does not permit unobstructed directing of light, but will always reduce maximum illumination. It is also known in the art that the brightness of the light emitted by fiber optical lamps may be controlled by means of a built-in iris diaphragm. U.S. Pat. Nos. 2,735,929 and 3,222,510 show a standard iris diaphragm. U.S. Pat. Nos. 2,336,119; 3,371,202; 4,018,527; 4,257,086; and 6,102,554 show an iris type diaphragm structure which operates in a fashion similar to a standard camera lens. However, an iris diaphragm will change the entrance angle of the light into the optical fiber and the exit angle of the light emanating from the optical fiber. Sectored diaphragms have the disadvantage that at least one diaphragm sector will remain in the light path even at maximum aperture and thus will reduce the maximum illumination that would otherwise be possible with the specific light source and light transmission capacity of the system. U.S. Pat. No. 4,425,599 proposes the use of a rotatable diaphragm disc having a single, sickle-shaped aperture of varying width between the light source and the optical fiber. By suitable selection of the shape of the sickle-shaped opening in the diaphragm disc, and the angular position of the rotatable diaphragm, a desired illumination is provided to the optical fiber. U.S. Pat. No. 6,850,367 also shows a diaphragm plate having a single arcuate opening, or a series of discrete sectored openings of various sizes around the plate. U.S. Pat. No. 4,834,071 shows a rotary shutter plate having a spiral periphery for use as a diaphragm an illumination controller. In this patent, a rotary shutter plate has an opening angle corresponding to the irradiation time or the luminance of a light beam to be fed to a light guide. U.S. Pat. No. 7,008,070 shows an illumination device and projector wherein a filter has alternating light transmission and non-transmissive rectangular areas. By rotating a holder, filtering films optically convert a light beam. U.S. Pat. No. 5,748,816 shows an optical cavity for receiving light parallel to an optical axis. An interior of a tube has sheet metal plates perpendicular to the optical axis of the tube, which are formed as aperture diaphragms with openings that become smaller along the optical axis of the tube in the direction of the incident radiation. U.S. Pat. No. 5,016,975 shows a light-emitting unit having a variety of discrete diaphragm shapes.

It has been determined that a problem with these aperture arrangements is non-uniformity of light intensity. The present invention provides a light exposure apparatus having improved uniformity of light intensity by means of a diaphragm having multiple openings positioned on the planar face of the diaphragm which have a continuously tapered width. These multiple tapered openings account for the top, middle, and bottom of the lamp light intensity range, whereas a single opening diaphragm of the prior art accounts for only one portion of the lamp light intensity range, usually, the middle portion.

SUMMARY OF THE INVENTION

The invention provides a light exposure apparatus which comprises a) a light source;

b) a light transmitter spaced from the light source, for transmitting light from the light source;

c) a light intensity controlling component positioned between the light source and the light transmitter; the light intensity controlling component comprising a light regulator having a planar face positioned between the light source and the light transmitter; the light regulator comprising a plurality of opaque, planar members, having a continuously tapered width, positioned adjacent to one another on the planar face of the light regulator; each planar member being spaced from its adjacent planar members by a planar, substantially light transparent segment having a continuously tapered width, positioned on the planar face of the light regulator; said light regulator being mounted for translation such that a portion of the opaque members and portion of the substantially light transparent segments are adjustably positioned between the light source and the light transmitter.

The invention also provides a light intensity controlling component comprising a light regulator having a planar face; a plurality of opaque, planar members, having a continuously tapered width, positioned adjacent to one another on the planar face; each planar member being spaced from its adjacent planar members by a planar, substantially light transparent segment having a continuously tapered width, positioned on the planar face regulator; said light regulator being mounted for translation such that a portion of the opaque members and portion of the substantially light transparent segments are adjustably positioned.

The invention further provides a method of exposing a photosensitive composition which comprises:

i) providing a photosensitive composition;

ii) providing a light exposure apparatus which comprises
   a) a light source;
   b) a light transmitter spaced from the light source, for transmitting light from the light source;
   c) a light intensity controlling component positioned between the light source and the light transmitter; the light intensity controlling component comprising a light regulator having a planar face positioned between the light source and the light transmitter; the light regulator comprising a plurality of opaque, planar members, having a continuously tapered width, positioned adjacent to one another on the planar face of the light regulator; each planar member being spaced from its adjacent planar members by a planar, substantially light transparent segment having a continuously tapered width, positioned on the planar face of the light regulator; said light regulator being mounted for translation such that a portion of the opaque members and portion of the substantially light transparent segments are adjustably positioned between the light source and the light transmitter;

d) directing actinic light onto the photosensitive composition from the light source, through the light intensity controlling component and through the light transmitter, for a sufficient time, and at a sufficient light intensity to cause a change of a condition of the photosensitive composition.

DESCRIPTION OF THE INVENTION

Figure 1:
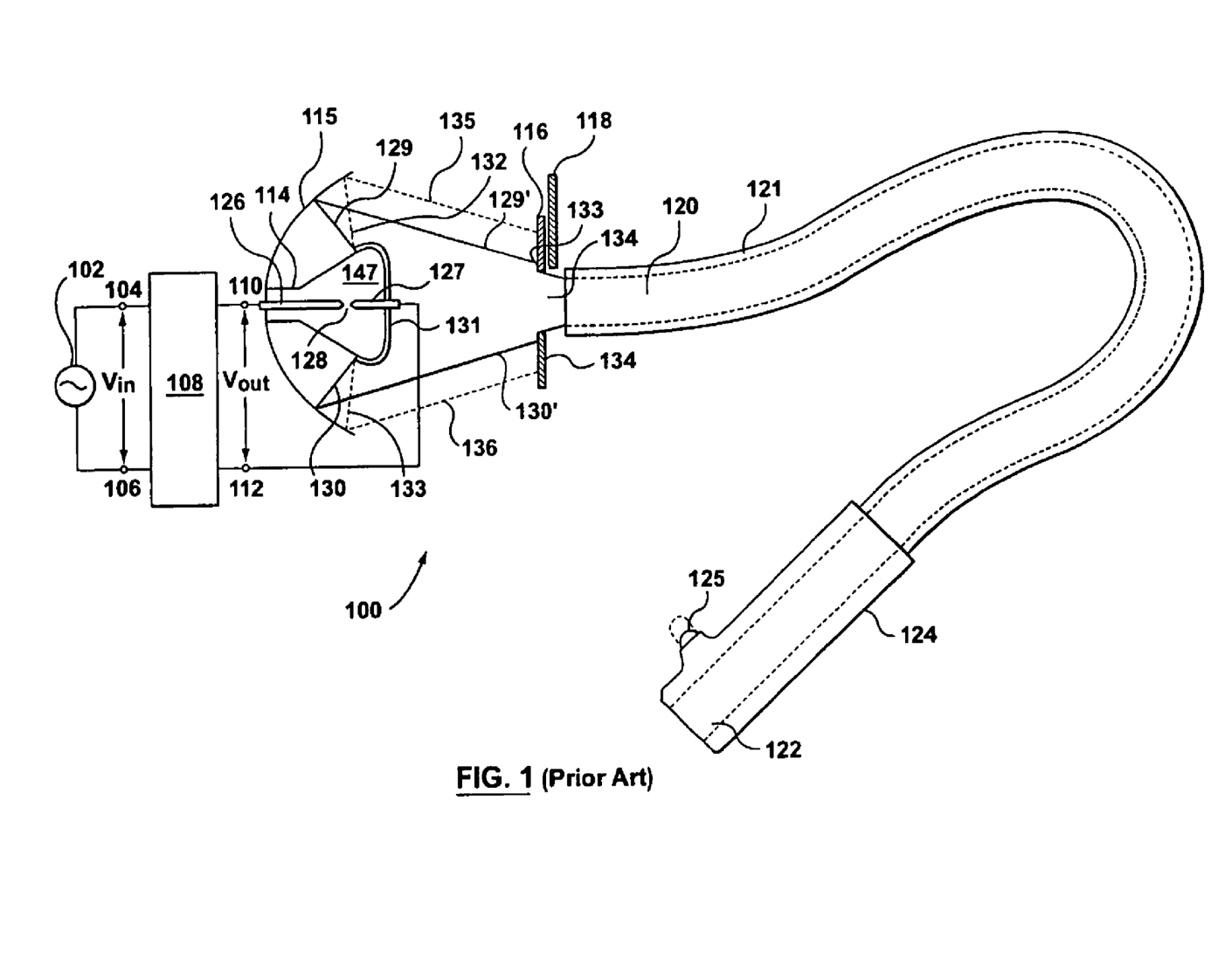
FIG. 1 illustrates a typical prior art illumination system for exposing photo-initiated adhesives with light energy.

FIG. 1 illustrates a prior art illumination system 100 from U.S. Pat. No. 6,515,430 used to expose photoinitiated adhesives to light energy. System 100 has a power source 102, pair of power input terminals 104, 106, a power supply 108, a pair of power output terminals 110, 112, a light source such as a lamp 114, a reflector 115, a diaphragm 116, a shutter 118, a light delivery device 120, and a handle 124.

A power source 102 is coupled to power input terminals 104, 106. Power source 102 provides an alternating current power signal $V_{in}$ across terminals 104 and 106. Power signal $V_{in}$ may be a typical municipal AC power supply and power source 102 may be operated by a typical municipal electric company. Power supply 108 receives power signal $V_{in}$ and provides a DC output power signal $V_{out}$ at terminals 110, 112, to which lamp 114 is coupled. Lamp 114 emits light in response to power signal $V_{out}$.

A light transmitter 120 may be a light guide such as an optical fiber, a bundle of optical fibers or another other light transmitting element. Typically, light delivery device 120 will have a protective cover 121, which may be made of plastic, rubber, metal or another material. Typically, light delivery device 120 will be 4-5 mm in diameter, although this dimension may vary substantially depending on the particular application of illumination system 100. Commercially available optical fibers with as few as 50 fibers per bundle or as many as 62,000 fibers per bundle are suitable.

A light intensity controlling component comprising a light regulator or diaphragm 116 and shutter 118, is positioned between the light source 114 and the light transmitter 120. Reflector 115 is positioned adjacent to lamp 114 to reflect the emitted light into light delivery device 120 through diaphragm 116. Diaphragm 116 has an opening sized to permit a round spot of light to fall on light delivery device 120. The light incident on light delivery device 120 is transmitted to the illuminating end 122 of the light delivery device 120, which is within and extends through handle 124. Light incident on light delivery device 120 from reflector 115 is emitted from the illuminating end 122.

Handle 124 has an illumination control button 125, which is coupled to shutter 118 by a control circuit, not shown. The control circuit operates to open shutter 118 when button 125 is depressed, as shown in solid outline in FIG. 1, and to close shutter 118 when button 125 in its normal extended position, as shown in the dotted outline in FIG. 1. When shutter 118 is closed, light from lamp 114 is blocked from entering light delivery device 120 and the illuminating end 122 of light delivery device 120 does not emit any light. When shutter 118 is open, the illuminating end 122 of light delivery device 120 emits light from lamp 114. Button 125 allows the operator of system 100 to open and close shutter 118 to control the amount of light emitted from the illuminating end 122 of light delivery device 120. Button 125 may be located in another position on illumination system 100. For example, it may be located on the housing of a part of the illumination system which contain lamp 114 and power supply 108. Button 125 is shown as part of handle 124 as an example only.

An operator uses system 100 by placing a photoinitiated adhesive (not shown) in a liquid form on a selected location (not shown), using handle 124 to point illumination end 122 of light delivery device 120 at the photoinitiated adhesive, depressing button 125 to begin exposing the photoinitiated adhesive to light from lamp 114, waiting for a pre-determined amount of time, which has been selected to start to photoinitiated adhesive to set into a solid form and releasing button 125 to stop exposing the photo-initiated adhesive, which then completes the curing process.

FIG. 1 further shows light source or lamp 114 which has a sealed region 147 which contains a gas such as xenon, argon, mercury, neon or another gas which emits light energy in response to an electrical potential. The light source light source according to this invention may be a commercially available light source including an incandescent lamp with an associated mirror, such as the cold-light mirror lamp obtainable from General Electric Company (Type DDL 150 W/20 V). Halogen lamps, i.e. incandescent lamps containing small amounts of gaseous halogen in the reduced-pressure atmosphere within the glass bulb around an incandescent wire made of tungsten, are also suitable. The light emitted may be ultraviolet or visible region of the electromagnetic spectrum.

In the apparatus of FIG. 1, a pair of electrodes 126, 127, which are coupled to power output terminals 110, 112, extend into the sealed region and have a gap 128 between them. When power signal $V_{out}$ is applied to electrodes 126, 127, the gas in sealed region 147 forms a plasma and begins to emit light. The majority of this emitted light is directed onto reflector 115 between lines 129 and 130. Lamp 114 may have a mirrored surface 131 to ensure that a majority of the light emitted by lamp 114 remains within lines 129 and 130. This light is then directed by reflector 115 as a light spot 133 onto diaphragm 116, as indicated by lines 129' and 130'. Preferably, light spot 133 is about the same size as the opening 134 in diaphragm 116 (i.e. it is only slightly smaller or larger than opening 134) and most of the reflected light passes through opening 134 onto light delivery device 120.

Over time, electrodes 126, 127 will erode in response to the power signal $V_{out}$ applied to them. As they erode, the gap 128 between them will grow. As a result, the limits of the same relative quantity of light energy which was initially emitted by lamp 114 between lines 129, 130 may now be emitted between dotted lines 132, 133. Reflector 115 will now reflect the emitted light onto a larger spot 134 on diaphragm 116, as indicated by dotted lines 135, 136. As a result, a smaller proportion of the light emitted by lamp 114, and a smaller absolute amount of light energy, is directed into light delivery device 120. This degradation in the optical coupling between lamp 114 and light delivery device 120 results in less light being available at the illuminating end 122 of light delivery device 120 to expose a photoinitiated adhesive, increasing the length of exposure required to start the photoinitiated adhesive to set.

The increased gap 128 between electrodes 126, 127 also changes the load characteristics of lamp 114. The impedance between the electrodes increases, causing the current drawn by lamp 114 from power supply 108 to fall. Power supply 108 is configured to maintain a constant level of power to lamp 114 by increasing the voltage component of power signal $V_{out}$. The constant power input into lamp 114 results in lamp 114 emitting a relatively constant amount of light, however, the degraded optical coupling still results in less light being directed into light delivery device 120. According to the invention, the light regulator 116 is positioned between the light source 114 and the light transmitter 120.

Figure 2A:
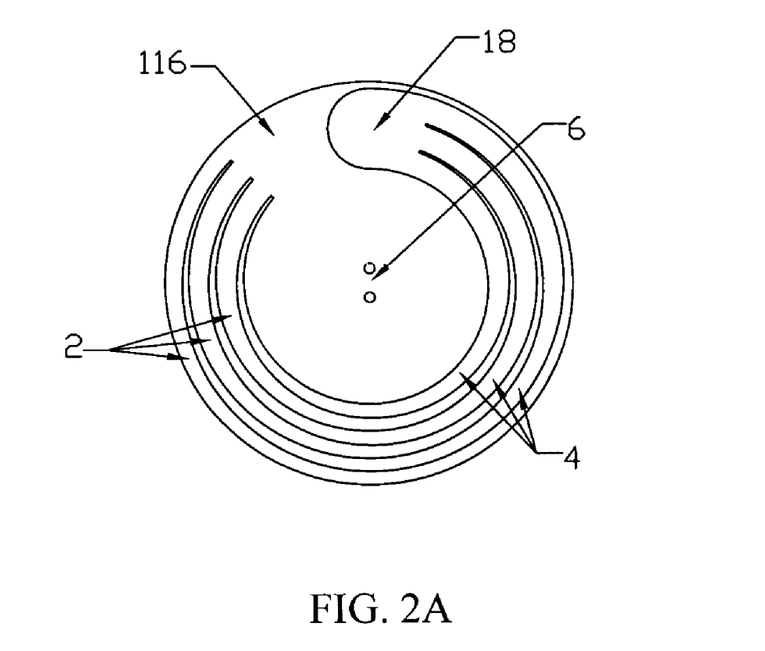
FIGS. 2A and 2B show an embodiment of the invention wherein the light regulator has a circular configuration.
Figure 2B:
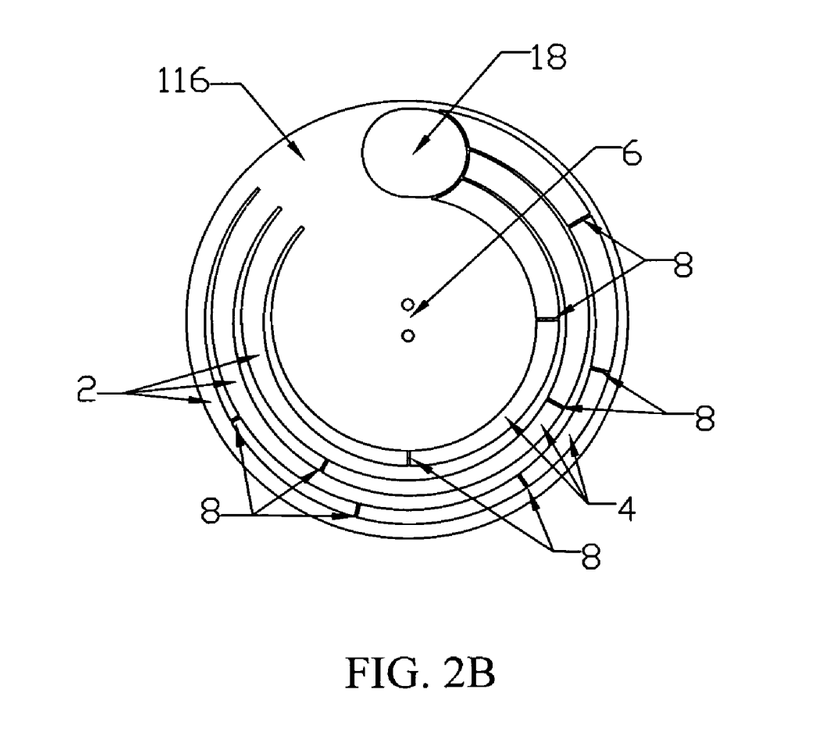

FIG. 2A shows one embodiment of a light regulator 116 according to the invention. The light regulator 116 comprises a plurality of opaque, planar members 2, having a continuously tapered width, positioned adjacent to one another on a planar face of the light regulator. Each planar member is spaced from its adjacent planar members by a planar, substantially light transparent segment 4 having a continuously tapered width, positioned on the planar face of the light regulator. The light transparent segments may comprise openings on the planar face of the light regulator, or they may comprise a transparent material such as a transparent plastic. The light regulator is preferably positioned in a plane perpendicular to a direction of light emitted from the light source to the light transmitter. The light regulator is mounted for translation, for example rotation, such that a portion of the opaque members and a portion of the substantially light transparent segments are adjustably positioned between the light source and the light transmitter. In the embodiment of FIG. 2A, the light regulator is a substantially circular disk, the planar members are arcuate and substantially concentric, and the substantially light transparent segments are also arcuate and concentric. Preferably the light exposure apparatus further comprises means for adjustably positioning the light regulator 116 between the light source 114 and the light transmitter 120. In the embodiment of FIG. 2A, the light regulator is mounted for rotation about an axis 6 such that a portion of the opaque members and portion of the substantially light transparent segments are adjustably positioned between the light source and the light transmitter. In one embodiment, the circular light regulator 116 is mounted on a rotatable axis 6 via a shaft, not shown. Such operation serves to control displacement of light regulator 116 until the desired portions of openings 4 that define the aperture is in operative position. The cross-sectional area of a light beam from light source 114 impinging upon an entrance plane of light transmitter 120 can be varied by displacement of the light regulator 116 so as to vary the aperture-effective width of the openings 4. The light regulator may be rotated manually, or may comprise a motor, not shown, for rotating the light regulator about the axis 6. The light regulator 116 may comprise two or more, preferably from about 3 to about 15, more preferably from about 3 to about 9, and still more preferably from 3 to about 5 of the substantially light transparent segments 4. The light regulator 116 may contain a large opening 18 which does not contain opaque members 2. In another embodiment as shown in FIG. 2B, the light regulator 116 has one or more supports 8 extending across the width of one or more of the substantially light transparent segments, which connect and buttress adjacent planar members 2. Without such supports, the light regulator may have a tendency to distort into a non-planar form. In one embodiment, the supports are staggered in position compared to the position of the supports for each other light transparent segment. The number and size of the supports should be minimal.

In one example, the output light intensity with the light regulator 116 in FIG. 2B was measured as a function of the rotational distance. The linear correlation coefficient was 0.996 with a 8 mm diameter light guide. It was similar with a 5 mm guide. A 2 pole 3 mm diameter light guide was also tested in the horizontal mode and vertical mode. Again, the linear correlation coefficient was similar for the different configurations. The light intensity difference between the horizontal mode and vertical mode with full rotation of the light regulator was less than 3%, indicating good uniform illumination at the various positions.

Figure 3A:
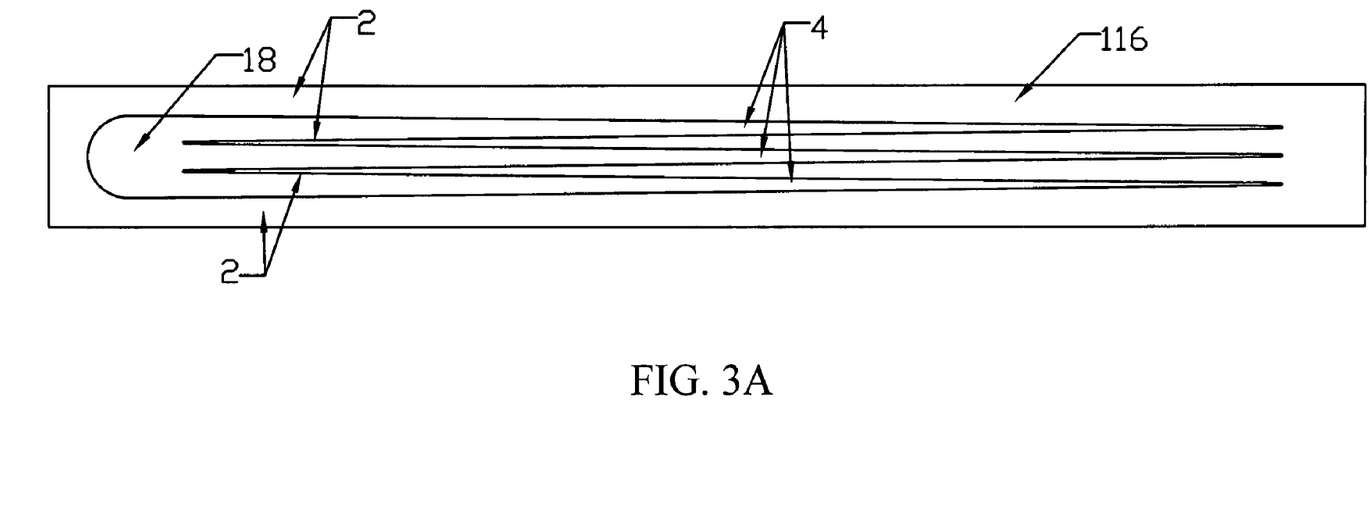
FIGS. 3A and 3B show another embodiment of the invention wherein the light regulator has a rectangular configuration.
Figure 3B:
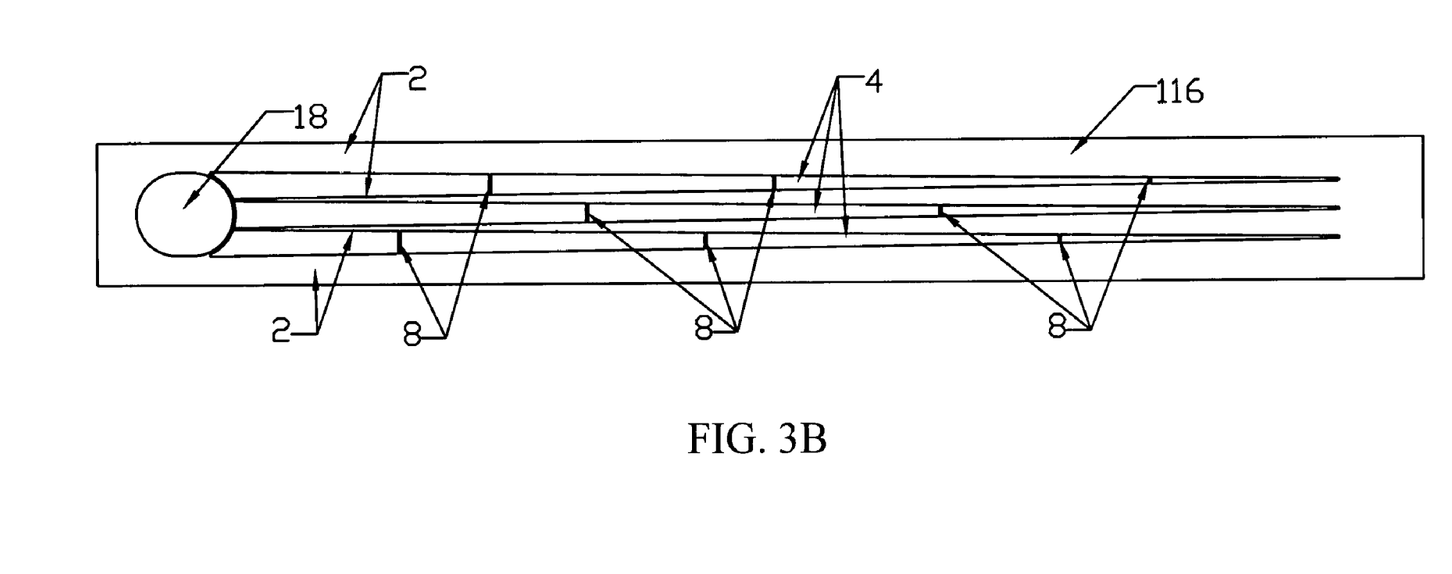

FIG. 3A shows another embodiment of the invention wherein the light regulator 116 has a rectangular configuration. In this embodiment, the planar members 2, and substantially light transparent segment 4 are wedge shaped and have a continuously tapered width, positioned on the planar face of the light regulator. The light regulator 116 may contain a large opening 18 which does not contain opaque members 2. The light regulator 116 having a rectangular configuration is suitably mounted for linear translation between the light source and the light transmitter. FIG. 3B shows a similar rectangular light regulator 116 with supports 8. Light regulators suitable for the invention can be made of opaque sheet materials from a variety of diverse materials, such as aluminum or other sheet metals, cardboard, wood, pigmented plastics, and the like. The method used for producing the opening may depend upon the material but punching, sawing and the like are typical.

Figure 4A:
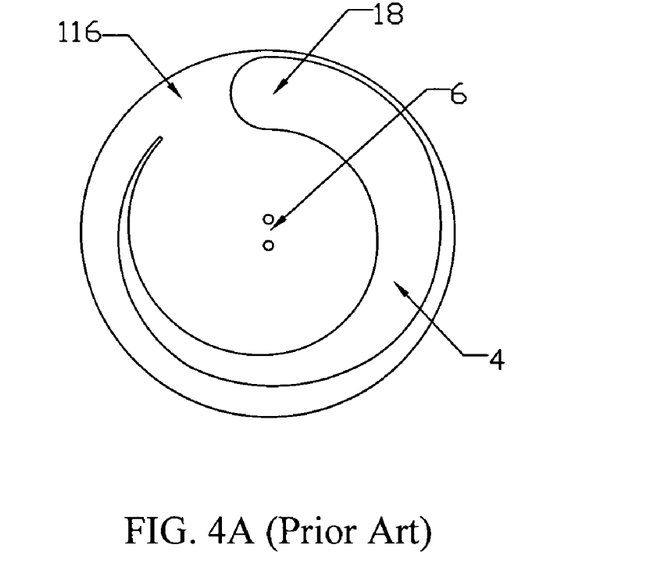
FIGS. 4A and 4B illustrate prior art light regulators.

FIG. 4A illustrates a prior art light regulator 116 with a single opening 4, with a large opening 18. The regulator 116 can be rotated around the axis 6. It does not contain a plurality of openings as found advantageous in the present invention.

Figure 4B:
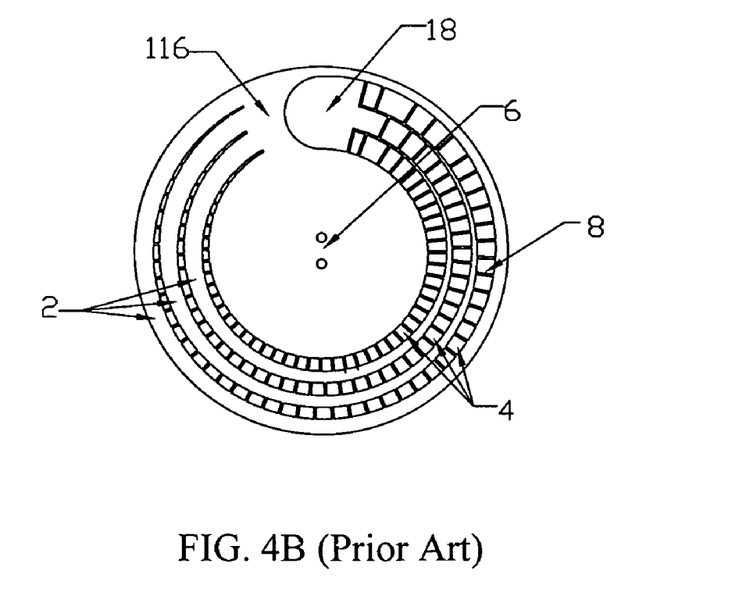

FIG. 4B illustrates a prior art light regulator 116 with many openings 4, with a large opening 18. The regulator 116 can be rotated around the axis 6. It contains many discontinuous openings 4, which are disadvantageous relative to the present invention. It has been found that the linear correlation coefficient with rotation was three times more accurate with the light regulator in FIG. 2B than with that in FIG. 4B. The light intensity difference between the horizontal mode and vertical mode with full rotation of the light regulator 116 in FIG. 4B, using the same 2 pole 3 mm diameter light guide which was used in the identical configuration with the light regulator in FIG. 2B, was 16%, indicating a poorer planar uniformity of light.

In use, the above described light exposure apparatus and a photosensitive composition are provided. Actinic light is directed onto a photosensitive composition from the light source, through the light intensity controlling component and through the light transmitter, for a sufficient time, and at a sufficient light intensity to cause a change of a condition of the photosensitive composition. In one embodiment, the photosensitive composition is disposed on a substrate. The photosensitive composition is suitably a light hardenable adhesive composition, coating composition, encapsulant composition, masking composition, or sealant composition, as are well known in the art. These non-exclusively include photosensitive composition comprising a polymerizable or crosslinkable material comprising an acrylate, a methacrylate, a cyanoacrylate, an epoxy, or combinations thereof. These may be reactive to ultraviolet light or visible light.

While the present invention has been particularly shown and described with reference to preferred embodiments, it will be readily appreciated by those of ordinary skill in the art that various changes and modifications may be made without departing from the spirit and scope of the invention. It is intended that the claims be interpreted to cover the disclosed embodiment, those alternatives which have been discussed above and all equivalents thereto.

What is claimed is:

1. A light exposure apparatus which comprises
   a) a light source;
   b) a light transmitter spaced from the light source, for transmitting light from the light source;
   c) a light intensity controlling component positioned between the light source and the light transmitter; the light intensity controlling component comprising a light regulator having a planar face positioned between the light source and the light transmitter; the light regulator comprising a plurality of opaque, planar members, having a continuously tapered width, positioned adjacent to one another on the planar face of the light regulator; each planar member being spaced from its adjacent planar members by a planar, substantially light transparent segment having a continuously tapered width, positioned on the planar face of the light regulator; said light regulator being mounted for translation such that a portion of the opaque members and portion of the substantially light transparent segments are adjustably positioned between the light source and the light transmitter.

2. The light exposure apparatus of claim 1 further comprising means for adjustably positioning the light regulator between the light source and the light transmitter.

3. The light exposure apparatus of claim 1 wherein the light regulator is substantially circular, the planar members are arcuate and substantially concentric, and the substantially light transparent segments are arcuate and concentric, said light regulator being mounted for rotation about an axis such that a portion of the opaque members and portion of the substantially light transparent segments are adjustably positioned between the light source and the light transmitter.

4. The light exposure apparatus of claim 3 further comprising a motor for rotating the light regulator about the axis.

5. The light exposure apparatus of claim 1 comprising two or more substantially light transparent segments.

6. The light exposure apparatus of claim 1 further comprising one or more supports extending across the width of one or more substantially light transparent segments, which supports connect adjacent planar members.

7. The light exposure apparatus of claim 1 further comprising one or more supports extending across the width of two or more substantially light transparent segments and connecting adjacent planar members, the one or more supports for each substantially light transparent segment being staggered in position to the position of the one or more supports for each other substantially light transparent segment.

8. The light exposure apparatus of claim 1 wherein the light regulator is positioned in a plane perpendicular to a direction of light emitted from the light source to the light transmitter.

9. The light exposure apparatus of claim 1 wherein the light intensity controlling component further comprises a light shutter for alternately allowing and prohibiting the directing of light from the light source to the light transmitter.

10. The light exposure apparatus of claim 9 wherein the light shutter is positioned between the light source and the light regulator.

11. The light exposure apparatus of claim 9 wherein the light shutter is positioned between the light regulator and the light transmitter.

12. The light exposure apparatus of claim 1 wherein the substantially light transparent segments comprise openings on the planar face of the light regulator.

13. A light intensity controlling component comprising a light regulator having a planar face; a plurality of opaque, planar members, having a continuously tapered width, positioned adjacent to one another on the planar face; each planar member being spaced from its adjacent planar members by a planar, substantially light transparent segment having a continuously tapered width, positioned on the planar face regulator; said light regulator being mounted for translation such that a portion of the opaque members and portion of the substantially light transparent segments are adjustably positioned.

14. The light exposure apparatus of claim 13 wherein the light regulator is substantially circular, the planar members are arcuate and substantially concentric, and the substantially light transparent segments are arcuate and concentric, said light regulator being mounted for rotation about an axis such that a portion of the opaque members and portion of the substantially light transparent segments are adjustably positioned.

15. The light exposure apparatus of claim 13 wherein the substantially light transparent segments comprise openings on the planar face of the light regulator.

16. A method of exposing a photosensitive composition which comprises:
   i) providing a photosensitive composition;
   ii) providing a light exposure apparatus which comprises
      a) a light source;
      b) a light transmitter spaced from the light source, for transmitting light from the light source;
      c) a light intensity controlling component positioned between the light source and the light transmitter; the light intensity controlling component comprising a light regulator having a planar face positioned between the light source and the light transmitter; the light regulator comprising a plurality of opaque, planar members, having a continuously tapered width, positioned adjacent to one another on the planar face of the light regulator; each planar member being spaced from its adjacent planar members by a planar, substantially light transparent segment having a continuously tapered width, positioned on the planar face of the light regulator; said light regulator being mounted for translation such that a portion of the opaque members and portion of the substantially light transparent segments are adjustably positioned between the light source and the light transmitter;
   d) directing actinic light onto the photosensitive composition from the light source, through the light intensity controlling component and through the light transmitter, for a sufficient time, and at a sufficient light intensity to cause a change of a condition of the photosensitive composition.

17. The method of claim 16 wherein the light regulator is substantially circular, the planar members are arcuate and substantially concentric, and the substantially light transparent segments are arcuate and concentric, said light regulator being mounted for rotation about an axis such that a portion of the opaque members and portion of the substantially light transparent segments are adjustably positioned between the light source and the light transmitter.

18. The method of claim 16 wherein the light intensity controlling component further comprises a light shutter for alternately allowing and prohibiting the directing of light from the light source to the light transmitter.

19. The method of claim 18 wherein the light shutter is positioned between the light source and the light regulator.

20. The method of claim 18 wherein the light shutter is positioned between the light regulator and the light transmitter.

21. The method of claim 16 wherein the substantially light transparent segments comprise openings on the planar face of the light regulator.

22. The method of claim 16 wherein the photosensitive composition is disposed on a substrate.

23. The method of claim 16 wherein the photosensitive composition is a light hardenable adhesive composition, coating composition, encapsulant composition, masking composition, or sealant composition.

24. The method of claim 16 wherein the actinic light comprises ultraviolet light.

25. The method of claim 16 wherein the actinic light comprises visible light.

26. The method of claim 16 wherein the photosensitive composition comprises a polymerizable or crosslinkable material comprising an acrylate, a methacrylate, a cyanoacrylate, an epoxy, or combinations thereof.

* * * * *